United States Patent [19]
Kong et al.

[11] Patent Number: 5,119,540
[45] Date of Patent: Jun. 9, 1992

[54] APPARATUS FOR ELIMINATING RESIDUAL NITROGEN CONTAMINATION IN EPITAXIAL LAYERS OF SILICON CARBIDE AND RESULTING PRODUCT

[75] Inventors: Hua-Shuang Kong, Raleigh; Thomas G. Coleman, Durham; Calvin H. Carter, Jr., Cary, all of N.C.

[73] Assignee: Cree Research, Inc., Durham, N.C.

[21] Appl. No.: 558,196

[22] Filed: Jul. 24, 1990

[51] Int. Cl.$^5$ .............................................. C30B 25/12
[52] U.S. Cl. .................... 29/25.01; 118/720; 156/612; 437/100
[58] Field of Search ............. 423/345; 118/720; 156/612, 613, DIG. 64; 29/25.01, 25.02; 148/DIG. 148; 437/100; 427/249, 255.1

[56] References Cited

U.S. PATENT DOCUMENTS

| | | | |
|---|---|---|---|
| 3,892,940 | 7/1975 | Bloem et al. | 219/10.49 |
| 3,956,032 | 5/1976 | Powell et al. | 148/175 |
| 4,277,320 | 7/1981 | Beguwala et al. | 204/164 |
| 4,425,407 | 1/1984 | Galasso et al. | 428/368 |
| 4,522,149 | 6/1985 | Garbis et al. | 118/725 |
| 4,582,561 | 4/1986 | Ioku et al. | 156/624 |
| 4,633,051 | 12/1986 | Olson | 219/10.49 R |
| 4,710,428 | 12/1987 | Tamamizu et al. | 428/408 |
| 4,798,926 | 1/1989 | Sakai | 219/10.43 |
| 4,823,736 | 4/1989 | Post et al. | 118/730 |
| 4,846,102 | 7/1989 | Ozias | 118/730 |
| 4,854,727 | 8/1989 | Pecot et al. | 374/57 |
| 4,858,557 | 8/1989 | Pozzetti et al. | 118/725 |
| 4,897,149 | 1/1990 | Suzuki et al. | 156/610 |
| 4,897,171 | 1/1990 | Ohmi | 204/298 |
| 4,912,064 | 3/1990 | Kong et al. | 437/100 |

FOREIGN PATENT DOCUMENTS 0233584  8/1987  European Pat. Off.

OTHER PUBLICATIONS

Choyke et al.; Review of Optical Work in SiC since 1968; From the Book: Silicon Carbide—1973, Edited by R. C. Marshall, J. W. Faust, Jr., and Ryan, University of South Carolina Press, Columbia, S.C. 1974.

Segall et al.; Compensation in Epitaxial Cubic SiC Films; NASA Technical Memorandum 87269; Mar., 1986.

Patrick et al.; Localized Vibrational Modes of a Persistent Defect in Ion-Implanted SiC; J. Phys. Chem. Solids, 1973, vol. 34, pp. 565-567. Pergamon Press. Printed in Great Britain.

Patrick et al.; Photoluminescence of Radiation Defects in Ion-Implanted 6H SiC; Physical Review B, vol. 5, No. 8, Apr. 15, 1972, pp. 3253-3259.

Freitas, Jr., et al.; Photoluminescence spectroscopy of ion-implanted 3C-SiC grown by chemical vapor deposition; J. Appl. Phys. 61(5), Mar. 1, 1987, pp. 2011-2016.

Okumura, et al.; Photoluminescence of Unintentionally Doped and N-Doped 3C-SiC Grown by Chemical Vapor Deposition; Electrotechnical Laboratory 1-1-4, umezono, Tusukuba, Ibaraki, 305 (Rec. Nov. 13, 1987; accepted for publ. Dec. 14, 1987).

Carlos, et al.; Residual Donors in Beta-SiC Films; Mat. Res. Symp. Proc. vol. 97, 1987; pp. 253-258.

Yoshida et al., Heteroepitaxial growth of SiC polytypes; Jul. 1, 1987; J. Appl. Phys. 62(1), pp. 303-305.

*Primary Examiner*—Olik Chaudhuri
*Assistant Examiner*—Ken Horton
*Attorney, Agent, or Firm*—Bell Seltzer Park & Gibson

[57] ABSTRACT

The invention is a method, and associated apparatus and product, of forming extremely pure epitaxial layers of silicon carbide by reducing the carrier concentration of residual nitrogen in silicon carbide formed by chemical vapor deposition processes. The method comprises placing a substrate upon which an epitaxial layer of silicon carbide will form upon a susceptor, and in which the susceptor is formed of a material that will not generate undesired nitrogen-containing out gases at the temperatures at which chemical vapor deposition of silicon carbide will take place from appropriate source gases. The substrate is heated to a temperature at which chemical vapor deposition of silicon carbide will take place from appropriate source gases by inductively heating the susceptor using an induction frequency that heats the susceptor material. Silicon-containing and carbon-containing source gases are then introduced that will form an epitaxial layer of silicon carbide upon the heated substrate.

14 Claims, 3 Drawing Sheets

APPARATUS FOR ELIMINATING RESIDUAL NITROGEN CONTAMINATION IN EPITAXIAL LAYERS OF SILICON CARBIDE AND RESULTING PRODUCT

FIELD OF THE INVENTION

The present invention relates to the growth of silicon carbide and in particular relates to the problem of the presence of undesired amounts of nitrogen as a residual donor dopant in epitaxial layers of silicon carbide grown by chemical vapor deposition.

BACKGROUND OF THE INVENTION

Silicon carbide has long been recognized as an extremely desireable substance for use as a semiconductor material Silicon carbide has a number of characteristics which make it theoretically advantageous for such uses. These include a wide band gap, a high thermal conductivity, a low dielectric constant, a high saturated electron drift velocity, a high breakdown electric field, a low minority carrier lifetime, and a high dissociation temperature. Taken together, these properties indicate that semiconductor devices formed from silicon carbide should be operable at much higher temperatures than devices made from other semiconductors, as well as at higher speeds and higher power levels. Silicon carbide's particular band gap and the associated transitions also makes it an appropriate candidate for producing light emitting diodes (LED's) in the blue portion of the visible spectrum.

More recently, significant progress has been made in the development of commercially viable silicon carbide suitable for electronic devices, including the growth of bulk crystals and the growth of epitaxial layers of both beta and alpha type silicon carbide upon silicon carbide substrates. Some of these techniques are set forth in U.S. Pat. Nos. 4,912,063; 4,912,064; 4,865,685; and 4,866,005, and associated devices of particular quality and usefulness are set forth in other patents; e.g. Pat. Nos. 4,875,083 (MIS-type capacitors); 4,918,497 (blue light emitting diodes); 4,947,218 (p-n junction diodes); and 4,945,394 (bipolar junction transistors).

These successes have resulted in some of the highest quality silicon carbide ever produced by either bulk or epitaxial growth methods. Therefore, they have in turn triggered further investigations and developments, and have raised new problems and challenges of which earlier workers were simply unaware.

In particular, silicon carbide, and specifically silicon carbide epitaxial layers grown by chemical vapor deposition, have a carrier concentration of residual nitrogen that generally always is, and has always been, at least $5 \times 10^{16}$ atoms per cubic centimeter ($cm^{-3}$) ("5E16"). Conventional wisdom holds that this residual nitrogen is a consequence of nitrogen present in the source and carrier gases used during chemical vapor deposition. The result is that silicon carbide epitaxial layers will always have donor atoms present to at least this extent. Although this may not always present a problem when the resulting silicon carbide is to be n-type, it raises significant difficulties when p-type silicon carbide is desired, and also causes problems in controlling the donor population of n-type layers. Because of residual nitrogen, such p-type epitaxial layers will always be "compensated" with a nitrogen donor to at least the extent of $5 \times 10^{16}$ $cm^{-3}$. As is known to those familiar with semiconductor devices and technology, such compensation can limit the usefulness or application of devices produced using such materials.

For example, in rectifying diodes, a higher population of donor (n-type) carriers in the p-type material decreases the carrier mobility of the resulting rectifier. Stated differently, the development of rectifying diodes with desireable or necessary higher reverse breakdown voltages requires a minimization of donor carriers in certain layers. In light emitting diodes ("LED's), where compensation is desired in at least one layer, the level of compensation is always critical, and variations in the amount of nitrogen present will raise serious difficulties.

In conventional semiconductor techniques, however, the reasons for the presence of nitrogen as an unwanted residual donor have not been recognized. This lack of recognition of the problem raised by nitrogen with respect to silicon carbide probably results from the fact that nitrogen does not act as a donor in silicon, the most widely used semiconductor material. Thus silicon, the most widely used semiconductor material the presence of 5E16 $cm^{-3}$ of nitrogen in silicon does not present the problem that such a concentration presents in silicon carbide.

Furthermore, chemical vapor deposition growth of silicon carbide typically takes place at temperatures much higher than the temperatures at which corresponding CVD growth of silicon takes place. For example, CVD of silicon takes place at temperatures of no more than about 1200° C., while that of silicon carbide preferably takes place at least about 1400° C. or higher. At higher temperatures, there exists a greater probability that the problem of impurities will be exacerbated. In CVD growth of silicon carbide, however, higher temperatures promote fewer defects in the resulting crystals. Thus, higher quality LED's are preferably formed from epitaxial layers grown at temperatures of at least 1500° C., and desirably at even higher temperatures, but conventional CVD systems and susceptors are only suitable at temperatures of about 1200° C. or less.

For example, most susceptors used for chemical vapor deposition are commonly formed of graphite and then coated with a layer of silicon carbide. The graphite provides a material with an appropriate resistivity for being inductively heated by electromagnetic energy within the medium portion of the radio frequency ("RF") range; usually the kilohertz (kHz) range. The silicon carbide coating provides an appropriately inert material upon which substrates can be placed during higher temperature operations.

In contrast to the conventional wisdom as to the root of the nitrogen contamination problem, the present inventors have discovered that much, and very likely all, of the undesired contamination in silicon carbide is a result of nitrogen gas that escapes from the susceptors during chemical vapor deposition. Because CVD growth of silicon carbide typically takes place at temperatures well above those necessary for CVD growth of silicon, such "out gases" may not be generated during silicon growth, and the problems they raise have accordingly remained unobserved prior to the more recent advances in silicon carbide technology described earlier.

It has thus only recently been observed that at the high temperatures required for CVD growth of silicon carbide, the silicon carbide coatings on most graphite susceptors begin to develop minute mechanical failures, often exhibited as cracks or pinholes. Because graphite is porous and absorbent for many gases, gases trapped in the graphite before the susceptor was formed escape through these cracks and pinholes and contaminate the silicon carbide epitaxial layers grown using such susceptors. For example, in most susceptor manufacturing processes, nitrogen is introduced at some point during the coating process. In other cases it appears that susceptors with cracks or pinholes will absorb atmospheric nitrogen every time a CVD growth cycle is completed and the growth chamber opened.

Thus, the relatively high residual n-type carrier concentration of epitaxial layers of silicon carbide grown by chemical vapor deposition has remained a problem for which conventional wisdom and techniques have failed to provide a solution Accordingly, it is an object of the present invention to produce silicon carbide in which the carrier concentration of nitrogen is less than $2 \times 10^{16}$ cm$^{-3}$, and to provide a method and associated apparatus for producing epitaxial layers of such silicon carbide by chemical vapor deposition.

SUMMARY OF THE INVENTION

In one embodiment, the invention comprises a method of forming extremely pure epitaxial layers of silicon carbide by reducing the carrier concentration of residual nitrogen in silicon carbide formed by chemical vapor deposition processes by placing a substrate upon which an epitaxial layer of silicon carbide will form upon a susceptor, and in which the susceptor is formed of a material that will not generate undesired nitrogen-containing out gases at the temperatures at which chemical vapor deposition of silicon carbide takes place from appropriate source gases. The substrate is then heated to a temperature at which chemical vapor deposition of silicon carbide will take place from appropriate source gases by inductively heating the susceptor using an induction frequency that heats the susceptor material, and while introducing silicon-containing and carbon-containing source gases that will form an epitaxial layer of silicon carbide upon the heated substrate.

In another embodiment, the invention comprises a susceptor for use in the chemical vapor deposition growth process for silicon carbide and which minimizes or eliminates nitrogen contamination in resulting epitaxial layers of silicon carbide, in which the susceptor is formed of silicon carbide in which the carrier concentration of donor atoms present is $5 \times 10^{16}$ cm$^{-3}$ (5E16) or less.

In a third embodiment, the invention comprises a susceptor formed of a core material that is responsive to medium frequency inductive heating and a layer of silicon carbide coated thereon in which the layer of silicon carbide is thin enough to prevent cracking of the silicon carbide layer at the temperatures required for chemical vapor deposition of silicon carbide while remaining thick enough to prevent the development of pinholes at the temperatures required for chemical vapor deposition of SiC.

In yet a fourth embodiment, the invention comprises a chemical vapor deposition (CVD) system for epitaxial growth of silicon carbide using inductive heating that minimizes or eliminates contaminants such as nitrogen in the resulting epitaxial layers of silicon carbide. The system comprises a boule susceptor formed of silicon carbide, a reaction chamber formed of a material that will withstand the temperatures at which chemical vapor deposition of silicon carbide will take place, an induction generator for producing a frequency that will inductively heat the silicon carbide boule, an induction electrode that will transmit the induction heating frequency to the boule, and a gas control system for introducing silicon containing and carbon-containing gases into the reaction chamber.

Finally, in another embodiment, the invention comprises an epitaxial layer of silicon carbide that has a residual and uncompensated donor carrier concentration of $1 \times 10^{16}$ atoms per cubic centimeter (cm$^{-3}$) or less, and the resulting devices that can be designed and produced using such silicon carbide.

BRIEF DESCRIPTION OF THE FIGURES

The foregoing and other objects and advantages of the invention will be best understood by reference to the detailed description taken in conjunction with the accompanying drawings, in which.

DETAILED DESCRIPTION

In a first embodiment, the present invention is a method of forming extremely pure epitaxial layers of silicon carbide by reducing the carrier concentration of residual nitrogen in silicon carbide, especially that formed by chemical vapor deposition processes. The method initially comprises placing a substrate upon which an epitaxial layer of silicon carbide will form upon a susceptor. In preferred embodiments the substrate is also formed of silicon carbide and preferably comprises a bulk single crystal of silicon carbide having a single polytype As set forth in the background, the growth and doping of such bulk substrates has been increasingly successfully demonstrated by the assignees of the present invention, and a useful description of such techniques is set forth in U.S. Pat. No. 4,866,005, as described earlier. As is often preferred in CVD growth processes, the bulk single crystal substrate may be in the form of a circular boule.

The susceptor upon which the substrate is placed is formed of a material which will not generate undesired nitrogen containing out gases at the temperatures at which chemical vapor deposition of silicon carbide takes place from the appropriate source gases. Thus, in preferred embodiments, the susceptor comprises a single crystal boule formed of silicon carbide having a concentration of donor atoms of $8 \times 10^{17}$ cm$^{-3}$ or less (8E17), although a polycrystalline boule formed of silicon carbide has also been demonstrated to be successfully incorporated in the method of the present invention. In more preferred embodiments the susceptor comprises a single crystal boule formed of silicon carbide in which the carrier concentration of donor atoms present is $1 \times 10^{17}$ cm$^{-3}$ (1E17) or less, and in the most preferred embodiment, the susceptor comprises a single crystal boule formed of silicon carbide in which the carrier concentration of donor atoms present is $5 \times 10^{16}$ cm$^{-3}$ (5E16) or less. In an alternative embodiment, and depending upon the application desired, the susceptor can comprise a one piece barrel formed of silicon carbide in which the carrier concentration of donor atoms present is likewise 5E16 or less.

The appropriate substrate is heated to a temperature at which chemical vapor deposition of silicon carbide will take place from appropriate source gases. As set forth earlier, CVD growth of silicon carbide preferably takes place at temperatures greater than 1400° C., and in the most preferred embodiments, the invention will comprise heating the substrate to a temperature of between about 1500° C. and 1800° C. Furthermore, as new operating parameters are developed while using the method of the present invention, it is expected that temperatures greater than 1800° C. will be used to advantage.

In the method of the present invention, the substrate is heated by inductively heating the susceptor using an induction frequency that heats the susceptor material. Preferably, the frequency used is one that will substantially penetrate and heat the susceptor to, and then maintain the susceptor at, the temperatures at which chemical vapor deposition of silicon carbide takes place. It will be recognized by those familiar both with semiconductor growth processes and the techniques and underlying theories of inductive heating, that the frequency that will serve to heat a particular material is related to that material's resistivity. Because silicon carbide has a high resistivity——and therefore has heretofore been considered difficult or impossible to heat inductively ——typical CVD susceptors have been formed of a lower resistivity material such as graphite and then coated with silicon carbide to provide a skin or outer shell that might withstand high temperature operation. Graphite can be heated at the more normal and expected inductive heating frequencies in the kilohertz (kHz) range, for example 450 kHz, but these frequencies will not penetrate or heat silicon carbide to any useful extent.

Therefore, the invention further comprises the step of inductively heating the silicon carbide susceptor using a frequency of at least 1 megahertz (Mhz), and most preferably comprises inductively heating the silicon carbide susceptor using a frequency of about 13.56 megahertz, which is an acceptable frequency set forth by the Federal Communications Commission (FCC) for use in scientific and industrial applications. As is further known to those familiar with these technologies, such a high frequency is generally used to generate plasmas rather than to perform inductive heating.

Finally, the method comprises introducing silicon-containing and carbon-containing source gases that will form an epitaxial layer of silicon carbide upon the heated substrate. In preferred embodiments, hydrogen ($H_2$) is used as a carrier gas, silane ($SiH_4$) as the silicon source gas, ethylene ($C_2H_4$) as the carbon containing gas, nitrogen ($N_2$) as a donor dopant source, and trimethylaluminum (($CH_3$)$_3$Al) as the acceptor dopant source.

The drawings illustrate an appropriate chemical vapor deposition (CVD) system for epitaxial growth of silicon carbide that uses inductive heating while minimizing or eliminating contaminants such as nitrogen in the resulting epitaxial layers of silicon carbide. The system comprises a susceptor 10 illustrated in FIGS. 1, 3, and 4, which in the preferred embodiment is a single crystal boule formed of silicon carbide. The susceptor 10 is maintained in a reaction chamber broadly designated at 11 (FIGS. 1 and 3) and which is formed of a material that will withstand the temperatures at which chemical vapor deposition of silicon carbide takes place. In preferred embodiments, the reaction chamber 11 comprises a quartz chamber that includes means for cooling the quartz while chemical vapor deposition processes are carried out in the chamber. A most preferred embodiment is perhaps best illustrated in FIG. 3 in which the quartz chamber is designated at 12. The cooling means comprises a polycarbonate jacket 13 that surrounds the quartz chamber 12 and forms a space 14 between the quartz chamber 12 and the jacket 13, and any appropriate means (not illustrated) for circulating water in and through the space 14.

Figure 1:
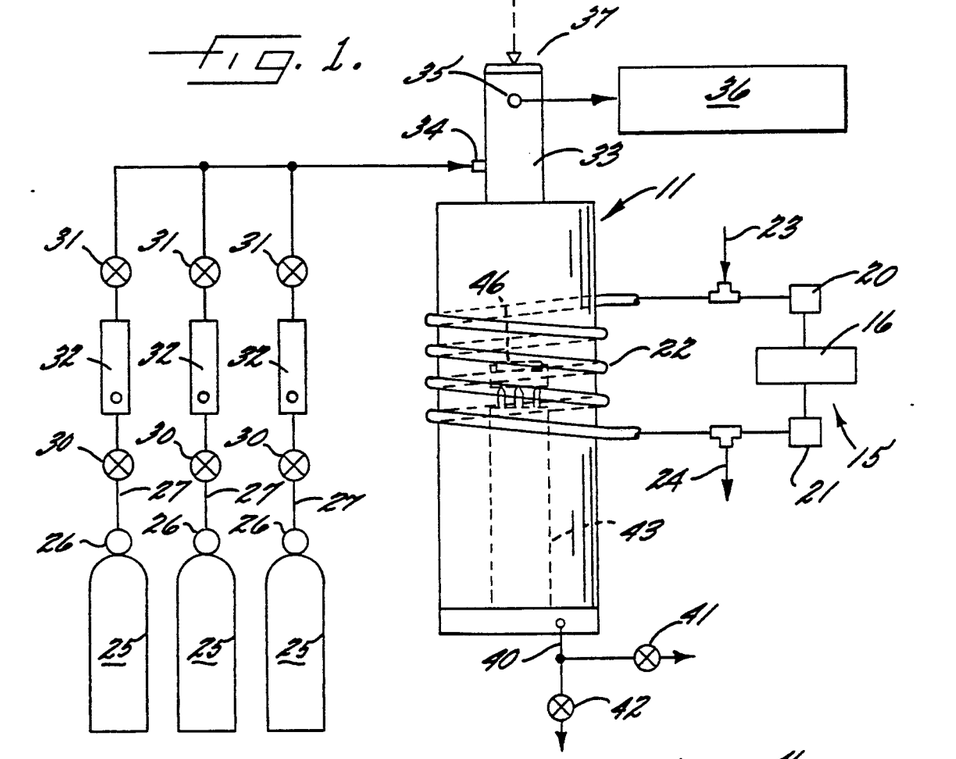
FIG. 1 is a schematic view of a chemical vapor deposition system according to the present invention.

The CVD system further comprises an induction generator means broadly designated at 15 for producing a frequency that will inductively heat the silicon carbide boule 10. The induction generator means 15 includes a power supply, a generator, and a tuning network for more precisely matching the induction frequency to the load formed by the susceptor. In FIG. 1, the power supply and generator are together designated at 16 and are matched to the load through the circuit formed by the variable capacitors 2? and 21 in the manner shown schematically in FIG. 2. The appropriate elements, circuitry and operation of such a generator circuit are generally well known to those of skill in this art and will not be described in detail other than as necessary to describe the present invention. Likewise, the appropriate tuning of the circuit to match a particular load can be accomplished by persons of ordinary skill in this art without undue experimentation.

In order to carry out the induction heating, the CVD system further includes an induction electrode that will transmit the induction heating frequency to the silicon carbide boule 10. In the illustrated embodiment, the induction electrode comprises a metal coil 22 which in the most preferred embodiment is formed of copper tubing and includes means for circulating a coolant through the tubing.

Figures 3, 5, 6:
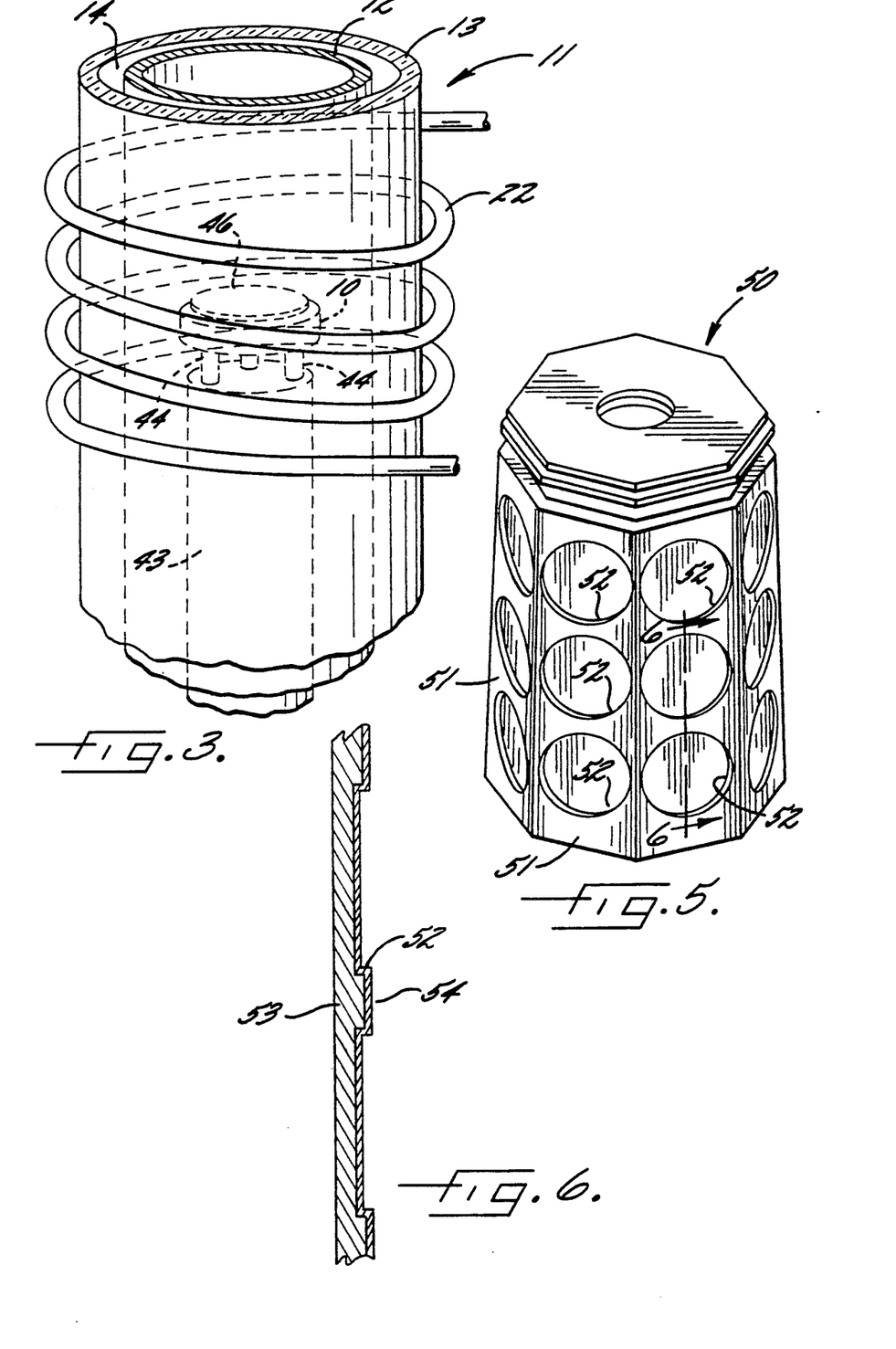
FIG. 3 is a partial perspective view of a portion of the chemical vapor deposition system of FIG. 1.
FIG. 5 is a perspective view of a barrel-type susceptor according to the present invention.
FIG. 6 is a cross-sectional view taken along lines 6—6 of FIG. 5.

As best illustrated in partial schematic fashion in FIG. 1, the copper tubing 22 is in electrical contact with the generator system 15, but is also in communication with an appropriate circulating water supply shown schematically as the inlet and outlet paths 23 and 24 respectively and which, as illustrated in FIGS. 1 and 3, permit water to be appropriately circulated through the copper tubing 22.

Figure 2:
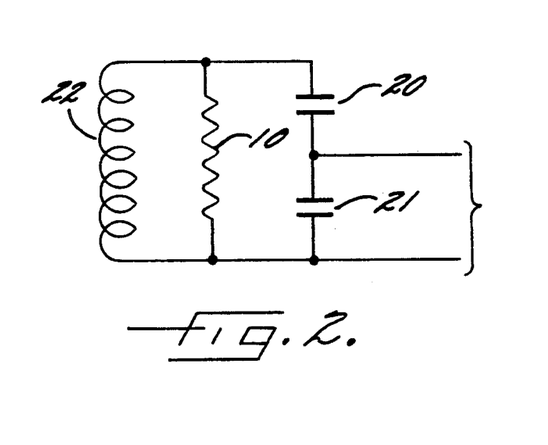
FIG. 2 is a circuit diagram of the main circuit elements of the chemical vapor deposition system illustrated in FIG. 1.

FIG. 2 is an exemplary, but not limiting, diagram of the generator network in which four turns of 3/16" copper tubing form the electrode 22 with a 3.1" inside diameter in circuit with a 5 kilowatt (kW) generator producing a frequency of 13.56 MHz. The susceptor 10 provides a resistance in parallel with the electrode 22, and the capacitors 20 and 21 are shown in their parallel and series arrangements. In one experiment, the susceptor was found to have a resistance of approximately 4250 ohms, and when the circuit was appropriately tuned, the electrode 22 had an inductance of 2 microhenrys (μH), the capacitor 20 had a capacitance of 73 picofarads (pF), and the other capacitor 21 590 pF. The susceptor became glowing hot at about 500 watts.

The CVD system also includes gas control means for introducing silicon containing and carbon containing gases into the chamber. The control of gases in a CVD system is well understood by those familiar with this art and will not otherwise be described in detail. To a great extent, the method of the present invention can be carried out in accordance with those techniques taught in U.S. Pat. Nos. 4,912,063 and 4,912,064, the contents of which are incorporated entirely herein by reference.

As a brief schematic description, however, FIG. 1 shows an appropriate series of supply tanks 25, and corresponding regulators 26, piping 27, valves 30 and 31, and filters 32. The gases from these sources, typically a carrier gas such as hydrogen, a silicon containing gas such as silane, and a carbon containing gas such as ethylene, are piped to the chamber through a header 33 (FIG. 1). The gases enter the header 33 through the inlet port 34. The gas control means, through a typical and appropriate system of pumping and suction, draws the gases downwardly into the chamber to encourage epitaxial growth. FIG. 1 also illustrates that a second inlet port 3$ is present in the chamber header 33 which communicates with a pressure transducer 36 so that the pressure in the chamber can be carefully monitored. As a particular advantage of the CVD system of the present invention, ports 34 and 3$ are placed substantially perpendicularly to one another with the gas inlet port 34 located below the transducer port 35, so that the flow of gas into and through the chamber does not modify pressure read by the transducer 36, thereby preventing a false pressure reading.

The top of the chamber header 33 also includes a quartz sight glass 37 which provides a sight line directly downwardly onto the boule 10 in the reaction chamber 11. In many prior systems, the temperature was measured optically from a position somewhat adjacent the boule and perpendicular to the chamber which raised problems during CVD deposition because of deposits occurring on the chamber walls, a somewhat common circumstance in such operations. In contrast, in the present invention, the location of the sight glass 37 offers an unrestricted optical sight line to the boule 10 so that its temperature can be carefully monitored at all times. Typically, an optical pyrometer will be used to monitor the temperature through the sight glass 37.

FIG. 1 also illustrates that the gas control system includes an appropiate flow path out of the chamber through the outlet pipe 40 and then to a vacuum pump with a process pressure control system through the respective valves 41 and 42.

Figure 4:
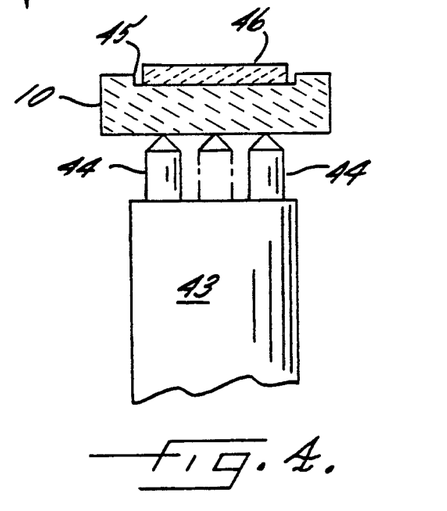
FIG. 4 is an enlarged cross-sectional view of a portion of the chemical vapor deposition system of FIG. 1.

FIG. 1 additionally illustrates that the susceptor 10 is maintained in position with respect to the electrode coil 22 by a pedestal 43 which in preferred embodiments is also made of quartz in order to withstand the temperature excursions of the CVD system. FIGS. 3 and 4 also illustrate that the pedestal 43 is toped by three legs 44 which support the silicon carbide boule 10 Each of the legs 44 tapers to a relatively small point upon which the boule 10 rests in order to minimize heat transfer between the boule 10 and the legs 44 during the CVD process.

FIG. 4 further illustrates that the boule 10 preferably includes a recess 45 within which a substrate wafer 46 may rest. Because substrate wafers such as the illustrated wafer 46 are generally formed with circular geometry, the recess 45 in the boule 10 will likewise usually be circular in shape.

In another embodiment, the invention comprises a susceptor for use in the chemical vapor deposition growth process for silicon carbide which comprises a core material that is responsive to medium frequency inductive heating and a layer of silicon carbide coated thereon. The layer of silicon carbide is thin enough to prevent cracking of the silicon carbide layer at the temperatures required for chemical vapor deposition of silicon carbide while remaining thick enough to prevent the development of pinholes at the temperatures required for chemical vapor deposition of silicon carbide.

FIGS. 5 and 6 illustrate one embodiment of such a susceptor which is broadly designated at 50. As familiar to those of skill in the particular arts, such a susceptor is often referred to as "barrel" susceptor and has the form of a several sided three dimensional solid, although it will be understood that in this particular embodiment the susceptor is not solid, but rather hollow inside. The overall shape of the susceptor is often designed to serve as a gas flow foil for promoting an even flow of gases over the substrate wafers. The various vertical sides 51 of the susceptor 50 include the circular recesses 52 for the purpose of receiving substrate crystals therein as described earlier. Typically, such a susceptor is placed in its illustrated upright position inside a CVD system similar to that shown in Figure 1, and provides physical support for the growth of epitaxial layers on a number of substrates at the same time.

FIG. 6 is cross sectional view of a portion of the susceptor 50 illustrating the core material 53 and the layer of silicon carbide 54. As stated earlier, in tis embodiment, the core material can be responsive to a medium frequency induction generator of about 450 kHz. The silicon carbide layer is generally between about 2 and 9 mils thick. The measurement of the thickness of the silicon carbide layer is somewhat sophisticated, and the particular result is often dependent upon the measurement technique; e.g. micrometer, beta-particle scattering, or eddy current measurements. It will be understood, however, that the thickness is chosen to meet the functional requirements described, namely a thickness which is thin enough to prevent cracking while thick enough to prevent the development of pinholes, all at the temperatures required for chemical vapor deposition of silicon carbide. In preferred embodiments, the core 53 comprises either graphite, a refractory metal such as molybdenum (Mo), niobium (Nb), tantalum (Ta), or tungsten (W), or a refractory metal carbide or silicide; e.g. NbC, WC, or $MoSi_2$.

As stated earlier, the result of the method and the use of the system described to carry out the method of the present invention is the production of epitaxial layers of silicon carbide that have a residual and uncompensated donor carrier concentration of $1 \times 10^{16}$ atoms per cubic centimeter ($cm^{-3}$) or less. It will thus be understood that the invention also comprises typical devices such as junction diodes that are formed in silicon carbide and that would comprise a p-type portion of silicon carbide and a n-type portion of silicon carbide with a p-n junction therebetween. The p-type portion would be formed from the silicon carbide having a residual carrier population of 1E16 or less and that has then been doped to a desired population of p-type carriers. Additionally, the population of the n-type portion can be appropriately minimized whenever so desired.

For example, because the reverse breakdown voltage of a p+/n− junction diode is inversely proportional to the population of n-type carriers in the n-type layer at depletion under reverse bias conditions, the invention's provision of a method of reducing the residual carrier concentration of silicon carbide correspondingly results in material which can be used to produce diodes of extremely high breakdown voltage, for example 1500 to 2000 volts or more.

Figure 7:
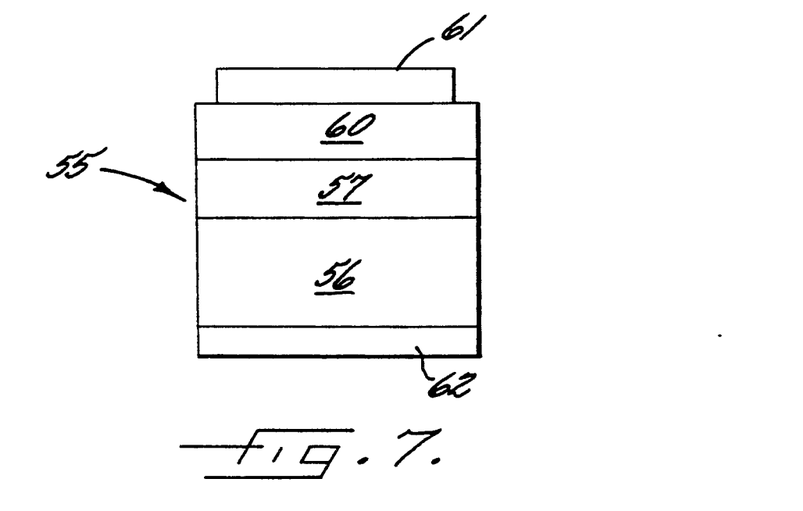
FIG. 7 is a cross sectional view of a rectifying diode formed using the epitaxial layers of silicon carbide made possible by the present invention.

A rectifying diode according to the invention is illustrated in FIG. 7 and is broadly designated at 55. The diode 55 includes a substrate 56, a first epitaxial layer 57, a second epitaxial layer 60, and ohmic contacts 61 and 62 to the epitaxial layer 60 and the substrate 56 respectively. In a typical configuration, the substrate 56 and the first epitaxial layer 57 are of the same conductivity type, p or n, and the second epitaxial layer 60 is of the opposite conductivity type so that a rectifying p-n junction is formed between the two epitaxial layers. An extended description of a similar rectifying diode is set forth in pending U.S. application Ser. No. 07/403,690; filed Sept. 6, 1989, the contents of which are incorporated entirely herein by reference.

In one embodiment the junction diode comprises a p-type portion formed from silicon carbide having a residual donor carrier population of $1 \times 10^4$ cm$^{-3}$ or less that has been doped to a desired population of p-type carriers. In another embodiment, the n-type portion has a donor carrier population of $1 \times 10^{16}$ cm$^{-3}$ or less.

Furthermore, the invention further can comprise the use of such an epitaxial layer in a light emitting diode formed in silicon carbide which comprises a p-type portion of silicon carbide and an n-type portion of silicon carbide with a p-n junction therebetween. In silicon carbide blue LEDs one of the portions, p or n, is generally always compensated. The degree of compensation is critical for both intensity and color purity. As a result, the uncontrolled——or uncontrollable——introduction of nitrogen by a susceptor will drastically upset the degree of compensation. Because the invention lowers the residual concentration of donors in silicon carbide, doping levels, and therefore compensation, can be much more precisely controlled. This results in LEDs that have greater intensity and higher color purity than LEDs produced by prior techniques.

Also, because the invention allows growth at higher temperatures, a resulting brighter LED is expected to result.

Figure 8:
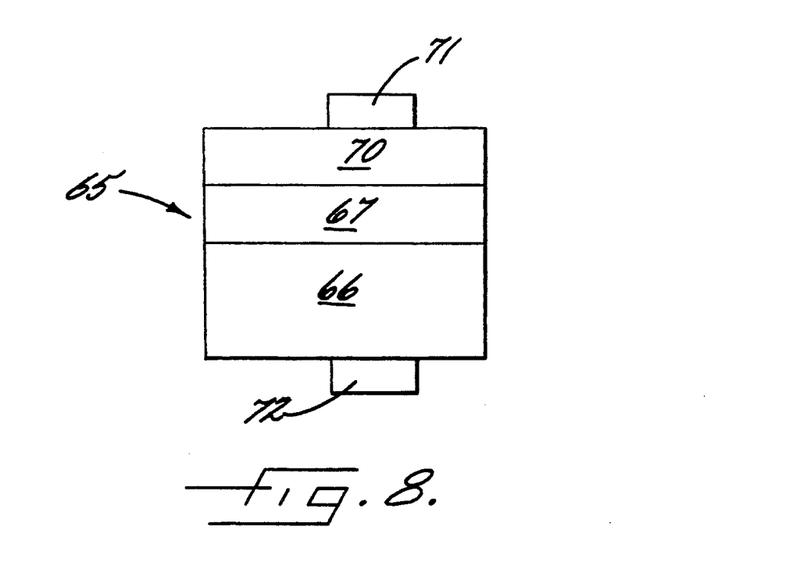
FIG. 8 is a cross sectional view of a light emitting diode formed using the epitaxial layers of silicon carbide made possible by the present invention.

A light emitting diode incorporating the features of the present invention is set forth in FIG. 8 and is broadly designated at 65. The diode 65 includes a substrate 66, a first epitaxial layer 67, a second epitaxial layer 70, and ohmic contacts 71 and 72 to the epitaxial layer 70 and the substrate 66 respectively. In a typical configuration, the substrate 66 and the first epitaxial layer 67 are of the same conductivity type, p or n, and the second epitaxial layer 70 is of the opposite conductivity type so that a light emitting p-n junction is formed between the two epitaxial layers. An extended description of such light emitting diodes is set forth in U.S. Pat. No. 4,918,497; the contents of which are incorporated entirely herein by reference.

In one embodiment, the LED comprises a p-type portion formed from silicon carbide having a residual carrier population of $1 \times 10^{16}$ cm$^{-3}$ or less that has been compensated to a controlled desired population of p-type and n-type carriers.

In the drawings and specifications, there have been disclosed typical preferred embodiments of the invention and, although specific terms have been employed, they have been used in a generic and descriptive sense only and not for purposes of limitation, the scope of the invention being set forth in the following claims.

That which is claimed is:

1. A susceptor for use in the chemical vapor deposition growth of silicon carbide which minimizes or eliminates nitrogen contamination in resulting epitaxial layers of silicon carbide that are formed upon substrates while using said susceptor, said susceptor comprising a single crystal boule formed of silicon carbide in which the carrier concentration of donor atoms present is $8 \times 10^{17}$ cm$^{-3}$ or less.

2. A susceptor according to claim 1 wherein the carrier concentration of donor atoms present is $1 \times 10^{17}$ cm$^{-3}$ or less.

3. A susceptor according to claim 1 wherein the carrier concentration of donor atoms present is $5 \times 10^{16}$ cm$^{-3}$ or less.

4. A susceptor according to claim 1 wherein said single crystal boule comprises a cylinder with a circular recess centered in the top surface thereof for receiving and maintaining a crystalline substrate therein.

5. A susceptor for use in the chemical vapor deposition growth process for silicon carbide which minimizes or eliminates nitrogen contamination in resulting epitaxial layers of silicon carbide, said susceptor comprising a one piece barrel formed of silicon carbide in which the carrier concentration of donor atoms present is $8 \times 10^{17}$ cm$^{-3}$ or less.

6. A susceptor according to claim 5 wherein the carrier concentration of donor atoms present is $1 \times 10^{17}$ cm$^{-3}$ or less.

7. A susceptor according to claim 5 wherein the carrier concentration of donor atoms present is $5 \times 10^{16}$ cm$^{-3}$ or less.

8. A susceptor for use in the chemical vapor deposition growth process for silicon carbide which minimizes or eliminates nitrogen contamination in resulting epitaxial layers of silicon carbide that are formed upon substrates while using said susceptor, said susceptor comprising: a core material that is responsive to medium frequency inductive heating and coated entirely with a layer of silicon carbide in which the layer of silicon carbide is thin enough to prevent cracking of the silicon carbide layer at temperatures of at least 1500° C. during chemical vapor deposition of silicon carbide while remaining thick enough to prevent the development of pinholes at temperatures of at least 1500° C. during chemical vapor deposition of silicon carbide.

9. A susceptor according to claim 8 wherein said susceptor is coated with a layer of silicon carbide that is between about 2 and 9 mils thick.

10. A susceptor according to claim 8 wherein said core material comprises graphite.

11. A susceptor according to claim 8 wherein said core material comprises a refractory metal.

12. A susceptor according to claim 11 wherein said refractory metal is selected from the group consisting of molybdenum, niobium, tantalum, and tungsten.

13. A susceptor according to claim 8 wherein said core material comprises a refractory metal carbide or a refractory metal silicide.

14. A susceptor according to claim 8 comprising a barrel susceptor.

* * * * *

UNITED STATES PATENT AND TRADEMARK OFFICE
CERTIFICATE OF CORRECTION

PATENT NO. : 5,119,540

DATED : June 9, 1992

INVENTOR(S) : Kong et al.

It is certified that error appears in the above-identified patent and that said Letters Patent is hereby corrected as shown below:

On the title page, item [56]:

UNDER "OTHER PUBLICATIONS":

In the sixth reference, "SiCGrown" should be --SiC Grown--.

At column 1, line 17, please insert a period --.-- after "material".

At column 2, lines 19-20, please inset a comma --,-- after "Thus" and delete "silicon, the most widely used semiconductor material".

At column 6, line 10, "Which" should be --which--.

At column 6, line 33, "2?" should be --20--.

At column 7, line 25, "3$" should be --35--.

At column 7, line 29, "3$" should be --35--.

At column 7, line 50, "appropiate" should be --appropriate--.

At column 7, line 60, please insert a period --.-- after "10".

At column 8, line 34, "tis" should be --this--.

UNITED STATES PATENT AND TRADEMARK OFFICE
CERTIFICATE OF CORRECTION

PATENT NO. : 5,119,540

DATED : June 9, 1992

INVENTOR(S) : Kong et al

It is certified that error appears in the above-indentified patent and that said Letters Patent is hereby corrected as shown below:

At column 9, line 26, "$10^4$" should be --$10^{16}$--.

Signed and Sealed this

Seventh Day of September, 1993

Attest:

BRUCE LEHMAN

Attesting Officer

Commissioner of Patents and Trademarks